(12) United States Patent
Knopf et al.

(10) Patent No.: US 10,649,343 B2
(45) Date of Patent: May 12, 2020

(54) METHOD AND DEVICE FOR MODIFYING IMAGING PROPERTIES OF AN OPTICAL SYSTEM FOR MICROLITHOGRAPHY

(71) Applicant: Carl Zeiss SMT GmbH, Oberkochen (DE)

(72) Inventors: Jochen Knopf, Aalen (DE); Mohammad Awad, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/444,323

(22) Filed: Jun. 18, 2019

(65) Prior Publication Data

US 2019/0302623 A1 Oct. 3, 2019

Related U.S. Application Data

(63) Continuation of application No. PCT/EP2017/081166, filed on Dec. 1, 2017.

(30) Foreign Application Priority Data

Dec. 21, 2016 (DE) .......................... 10 2016 225 899

(51) Int. Cl.
*G03F 7/20* (2006.01)
*G06N 20/00* (2019.01)

(52) U.S. Cl.
CPC .......... *G03F 7/705* (2013.01); *G03F 7/70191* (2013.01); *G03F 7/70258* (2013.01);
(Continued)

(58) Field of Classification Search
CPC ............ G03F 7/70191; G03F 7/70258; G03F 7/70266; G03F 7/70308; G03F 7/705; G03F 7/70516; G03F 7/70591; G06N 20/00

(Continued)

(56) References Cited

U.S. PATENT DOCUMENTS 6,528,331 B1  3/2003  Bode et al.
2004/0232237 A1* 11/2004 Kasai ................. G02B 7/005
                                            235/454

(Continued)

FOREIGN PATENT DOCUMENTS

DE  10 2011 005 940 A1  9/2012
DE  10 2013 219 986 A1  4/2015
WO  WO 2016/087388 A1  6/2016

OTHER PUBLICATIONS

Stuart Russel, Peter Norvig, *Artificial Intelligence: A Modern Approach*: Chapter 18: Learning from Examples, Verlag Prentice Hall, p. 693-763.

(Continued)

*Primary Examiner* — Colin W Kreutzer
(74) *Attorney, Agent, or Firm* — Fish & Richardson P.C.

(57) ABSTRACT

The disclosure provides a method and an apparatus for modifying imaging properties of a microlithographic optical system. In a method according to the disclosure, the imaging properties are modified by way of control signals coupled into the optical system by way of at least one interface. The values of the control signals that are in each case coupled in during the controlling for a desired modification of the imaging properties are ascertained on the basis of a model. The model is created by virtue of performing, in a learning phase in which the modification of the imaging properties that is in each case attained for different values of the control signals is ascertained, a successive individual adaptation of the model to the optical system. The learning phase is performed without prior specification of explicit information relating to internal mechanisms of action within the optical system.

20 Claims, 5 Drawing Sheets

(52) U.S. Cl.
CPC ...... *G03F 7/70266* (2013.01); *G03F 7/70308* (2013.01); *G03F 7/70516* (2013.01); *G03F 7/70591* (2013.01); *G06N 20/00* (2019.01)

(58) Field of Classification Search
USPC .................................... 355/55, 67, 68, 77
See application file for complete search history.

(56) References Cited

U.S. PATENT DOCUMENTS

| 2014/0285783 A1 | 9/2014 | Dinger et al. |
| 2016/0170311 A1 | 6/2016 | Schmitt-Weaver et al. |
| 2016/0209754 A1 | 7/2016 | Bittner et al. |

OTHER PUBLICATIONS

U.S. Publication 2014/0285783 is a US counterpart of DE 10 2011 005 940 A1, previously cited.
U.S. Publication 2016/0209754 is a US counterpart of DE 10 2013 219 986 A1, previously cited.
Translation of International Search Report for corresponding Appl. No. PCT/EP2017/081166, dated Mar. 28, 2018.
GPTO-Office Action, with translation thereof, for corresponding Appl No. DE 10 2016 225 899.0, dated Aug. 16, 2017.
IPRP for corresponding Appl No. PCT/EP2017/081166, dated Jul. 4, 2019.

\* cited by examiner

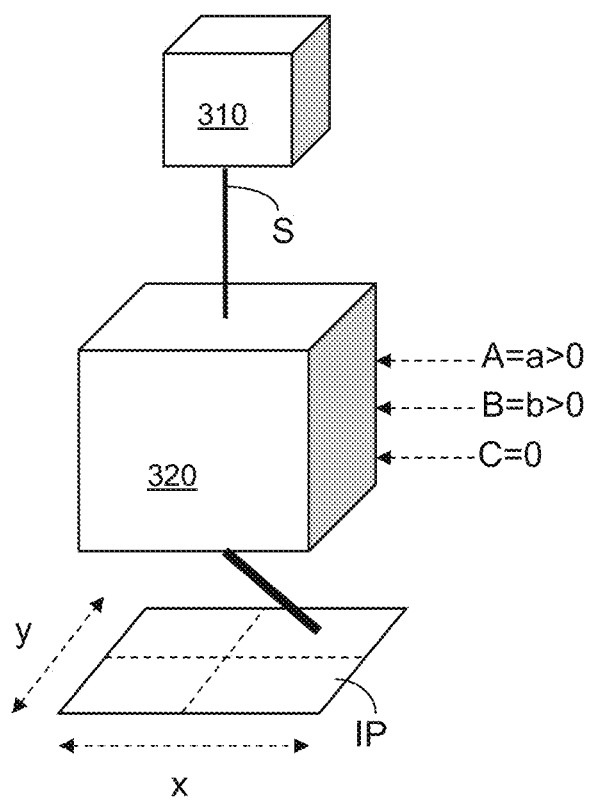

METHOD AND DEVICE FOR MODIFYING IMAGING PROPERTIES OF AN OPTICAL SYSTEM FOR MICROLITHOGRAPHY

CROSS-REFERENCE TO RELATED APPLICATIONS

The present application is a continuation of, and claims benefit under 35 USC 120 to, international application PCT/EP2017/081166, filed Dec. 1, 2017, which claims benefit under 35 USC 119 of German Application No. 10 2016 225 899.0, filed Dec. 21, 2016. The entire disclosure of each of these applications is incorporated by reference herein.

FIELD

The disclosure relates to a method and an apparatus for modifying imaging properties of a microlithographic optical system.

BACKGROUND

Microlithography is used for producing microstructured components, such as for example integrated circuits or LCDs. The microlithography process is carried out in what is called a projection exposure apparatus, which includes an illumination device and a projection lens. The image of a mask (=reticle) illuminated via the illumination device is in this case projected via the projection lens onto a substrate (for example a silicon wafer) coated with a light-sensitive layer (photoresist) and arranged in the image plane of the projection lens, in order to transfer the mask structure to the light-sensitive coating of the substrate.

To increase the image position accuracy and image quality (both along the optical axis, or in the light propagation direction, and in the lateral direction, or perpendicular to the optical axis or light propagation direction), it is known in particular to configure one or more of the optical elements (e.g., mirrors) in the optical system as adaptive or actuable elements.

Merely by way of example, it is known to configure one or more mirrors in the optical system with an actuator layer made from a piezoelectric material, wherein an electrical field having locally varying strength is produced across the piezoelectric layer with a consequence that the reflection layer system of the adaptive mirror deforms together with a local deformation of the piezoelectric layer. Consequently, (possibly also temporally varying) imaging aberrations can be at least partially corrected by way of suitably controlling the electrodes. However, the deformation of the reflection layer system of a mirror or actuation of another optical element, such as a lens element, can also be used in general to further optimize the microlithographic imaging process.

In order to allow the setting of the surface curvature of the relevant adaptive optical element in practice as precisely as possible in temporally stable fashion, various approaches are known, wherein in principle a distinction is made between model-based open-loop control of the respective actuators of the adaptive element and closed-loop control of the actuators based on measurement data.

In a known approach for realizing the model-based open-loop control of the actuators, a model employing explicit knowledge or information relating to the construction and typical material properties of the relevant element is created and used to calculate the respectively attained surface curvature, wherein controlling of the actuators is effected without knowledge of the actually attained surface curvature, and in particular without a corresponding sensor system or without a closed-loop control system.

In such an open-loop control based on an explicit model, however, in practice—as will be explained in more detail below—it may arise that the validity of an explicit model on which the open-loop control is based is limited when specific "unique" properties of the concrete optical system (for example a specific imaging behavior owing to individual manufacturing errors) are present, wherein an appropriate correction or model adaptation can prove to be extremely complex in view of the large number of influencing parameters that may need to be taken into account in this case. As concerns the closed-loop control of the actuators based on measurement data (for example measurements of the actually attained surface curvature of the respective element) that is likewise conceivable as an alternative to the previously described model-based open-loop control, the attainable exactness of the surface curvature can indeed be improved in this respect, but this can entail inter alia an increase in constructive complexity in view of the optical measurement method that is used therefor.

Reference is made merely by way of example to DE 10 2011 005 940 A1.

SUMMARY

The present disclosure seeks to provide a method and an apparatus for modifying imaging properties of a microlithographic optical system that make possible a modification that is as accurate as possible with comparatively little complexity.

In one aspect, the disclosure provides a method for modifying imaging properties of a microlithographic optical system. The imaging properties are modified by way of control signals that are coupled into the optical system by way of at least one interface. The values of the control signals that are in each case coupled in during the controlling for a desired modification of the imaging properties are ascertained on the basis of a model. The model is created by virtue of performing, in a learning phase in which the modification of the imaging properties that is in each case attained for different values of the control signals is ascertained, a successive individual adaptation of the model to the optical system. The learning phase is performed without prior specification of explicit information relating to internal mechanisms of action within the optical system.

In another aspect, the disclosure provides a microlithographic optical system, characterized in that the apparatus is configured to carry out such a method.

According to an embodiment, at least one element of the optical system is actuated for modifying the imaging properties, wherein the actuation is effected by controlling the at least one actuator on the basis of the control signals.

The disclosure is based in particular on the concept that, starting from the principal of model-based control of actuators for actuating an element, the model used here is not created or specified for example as in the conventional approach that was described in the introductory part using explicit knowledge relating to construction, material properties, etc. of the relevant element, but rather that the model or the knowledge being included therein is worked out implicitly in a learning phase by way of training on the real optical system.

In other words, the method according to the disclosure dispenses with the concept of modeling in advance mechanisms of action or cause-effect relationships for the element that is to be actuated or for the system containing the element and of using them as a basis in the form of an explicit model of controlling the actuators, and instead specifically leaves it up to a learning phase (according to the concept of artificial intelligence or neural networks that is known per se from informatics) to discover the relationships by itself or automatically by virtue of ascertaining in the learning phase how the concrete optical system reacts to different, permissible values of the control signals or to the actuation of the respective element that is caused thereby (for example the attained surface curvature of an adaptive mirror).

Due to the fact that a specification of the model based on explicit knowledge of the properties of the concrete system or element is dispensed with, the (e.g., development) actions for establishing such explicit knowledge are not required, resulting in a significant conservation of resources.

Moreover, a significant advantage of creating, according to the disclosure, the model on which the open-loop control of the respective optical element is based in a learning phase on the real optical system (that is to say the "implicit modeling") lies in the fact that the here implicitly created model is already optimally tailored to the concrete system or the adaptive element mounted therein, wherein in particular any process fluctuations or manufacturing tolerances are automatically taken into consideration in the model without additional complexity or special measures. As a result, it is thus possible with comparatively low complexity to attain a more exact description or prediction of the actually effected change of imaging properties (for example by describing the respectively attained surface curvature of the element), wherein in particular a modification of the model structure as in the previously described scenario in the case of explicit modeling is not required at any time.

Moreover, dynamic influences or drift effects are automatically included, or included without additional measures, in the model created in the implicit modeling according to the disclosure and thus likewise automatically taken into consideration due to the learning phase extending over a specific (possibly prolonged) time duration in the method according to the disclosure.

Furthermore, to a certain extent an improvement in the quality of the model created in accordance with the disclosure can be achieved due to prolonging the time duration of the training or the learning phase, which is implementable relatively easily and cost-effectively, for example as compared to an increased development complexity of the conventional explicit modeling described in the introductory part.

In principle, the model creation according to the disclosure on the basis of the approach of artificial intelligence, for example in the form of a neural network, that is known per se from the field of informatics makes possible the calculation of predictions even for situations that have as yet not occurred, with the consequence that an increased level of capability of open-loop control according to the disclosure can be obtained that in particular may even reach the level of capability of closed-loop control.

As compared to the approaches which were described in the introductory part relating to a closed-loop control based on measurement data, the method according to the disclosure has in particular the advantage that it is possible to dispense with corresponding optical measurement systems and the associated constructive development complexity.

As a result, not only is the constructive complexity associated with closed-loop control based on actual measurement results therefore avoided in the method according to the disclosure, but open-loop control of the modification of imaging properties of the optical system that more closely approaches the results that are attainable with closed-loop control approaches and is relatively exact compared to explicit modeling is also realized.

With respect to the behavior of the concrete optical system described by the implicit modeling according to the disclosure, the disclosure is not limited to a mechanical behavior of the system, but is applicable to any desired mechanisms of action, including thermal behavior, transmission behavior, and electronic or electromagnetic behavior.

According to one embodiment, the model is created using a method of artificial intelligence, wherein training with coupling of different values of the control signals into the optical system is performed in the learning phase.

According to one embodiment, the method of artificial intelligence is selected from the group including supervised learning, unsupervised learning, and semi-supervised learning. A neural network can be used here, for example. However, the disclosure is not limited to the application of a specific method of artificial intelligence, but is able to be realized with any desired suitable method. In this context, reference is made to Stuart Russell, Peter Norvig: "Artificial Intelligence: A Modern Approach," Prentice Hall (ISBN-10: 0136042597).

According to one embodiment, the adaptation of the model to the optical system in the learning phase takes place without modification of the model structure.

According to one embodiment, the model correlates only imaging properties that are observable from outside the optical system with control signals that are variable from outside the optical system.

According to one embodiment, the optical element is a deformable optical element, in particular a deformable mirror.

According to one embodiment, the optical system is a microlithographic projection exposure apparatus, including an illumination device and a projection lens, wherein the illumination device illuminates a mask having structures to be imaged that are arranged in an object plane of the projection lens with used light having an operating wavelength during the operation of the projection exposure apparatus and wherein the projection lens images the structures onto a substrate arranged in an image plane of the projection lens.

The disclosure furthermore relates to an apparatus for modifying imaging properties of a microlithographic optical system, configured to perform a method having the previously described features, and to a microlithographic projection exposure apparatus equipped with such an apparatus. With regard to advantages and advantageous configurations of the apparatus, reference is made to the above explanations in association with the method according to the disclosure.

Further configurations of the disclosure can be taken from the description and the dependent claims.

BRIEF DESCRIPTION OF THE DRAWINGS

The disclosure is explained in greater detail below on the basis of exemplary embodiments that are represented in the accompanying figures, in which:

FIGS. 3A-3E show schematic illustrations for explaining an example of using the disclosure.

DETAILED DESCRIPTION OF PREFERRED EMBODIMENTS

Figure 1:
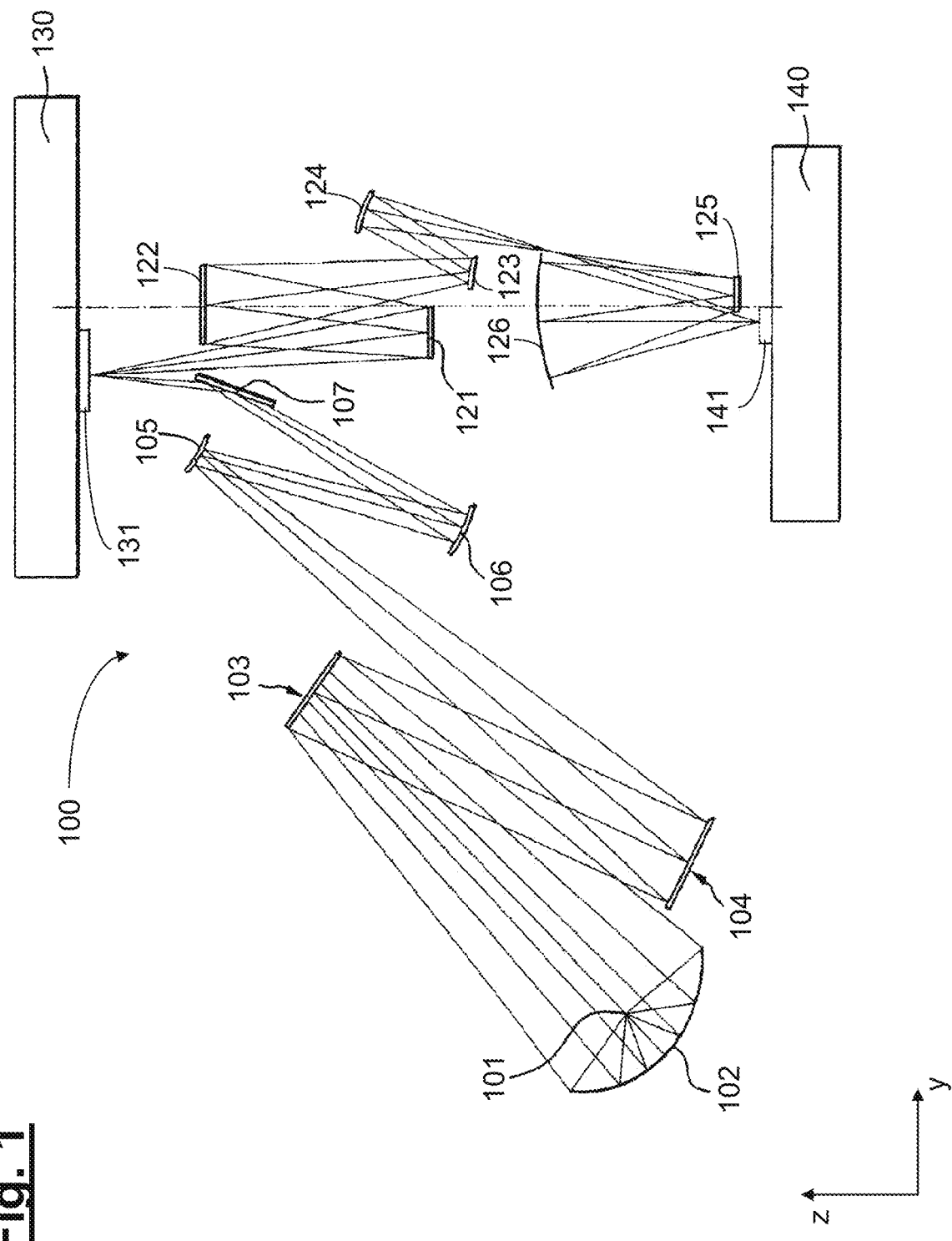
FIG. 1 shows a schematic illustration of a projection lens of a microlithographic projection exposure apparatus which is designed for operation in the EUV range and in which the disclosure is able to be realized in an exemplary manner.

FIG. 1 firstly shows a schematic illustration of a projection exposure apparatus 100 which is designed for operation in the EUV and in which the disclosure is able to be realized in an exemplary manner.

According to FIG. 1, an illumination device of the projection exposure apparatus 100 includes a field facet mirror 103 and a pupil facet mirror 104. The light from a light source unit including in the example an EUV light source (plasma light source) 101 and a collector mirror 102 is directed onto the field facet mirror 103. A first telescope mirror 105 and a second telescope mirror 106 are arranged in the light path downstream of the pupil facet mirror 104. A deflection mirror 107 is arranged downstream in the light path, the deflection mirror directing the radiation that is incident thereon onto an object field in the object plane of a projection lens including six mirrors 121-126. At the location of the object field, a reflective structure-bearing mask 131 is arranged on a mask stage 130, the mask being imaged with the aid of the projection lens into an image plane in which a substrate 141 coated with a light-sensitive layer (photoresist) is situated on a wafer stage 140.

Figure 2:
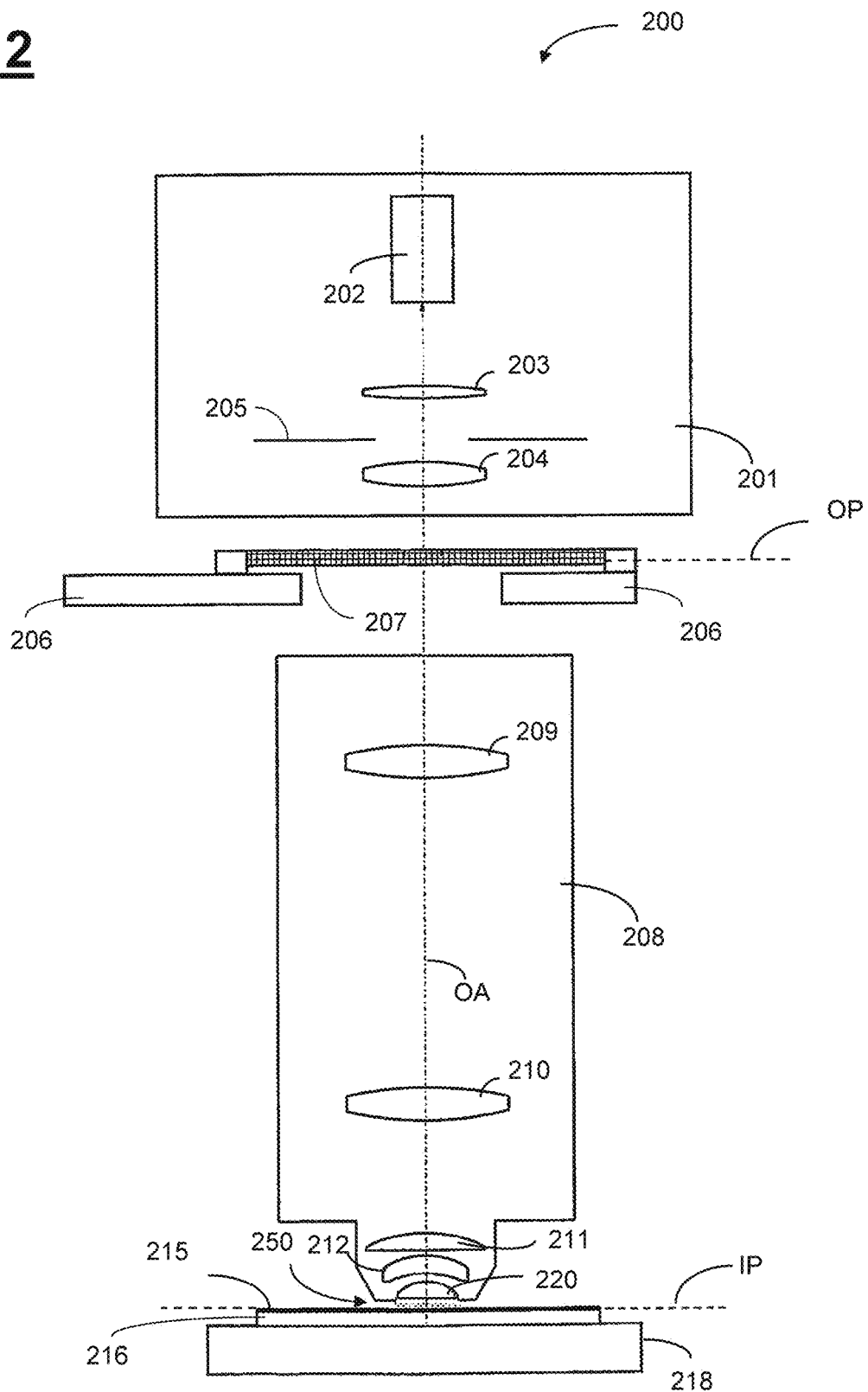
FIG. 2 shows a schematic illustration of a projection lens of a microlithographic projection exposure apparatus which is designed for operation in the DUV range and in which the disclosure is able to be realized.

FIG. 2 shows a schematic illustration of a further possible construction of a microlithographic projection exposure apparatus 200 which is designed for operation at wavelengths in the DUV range (for example approximately 193 nm) and likewise includes an illumination device 201 and a projection lens 208.

The illumination device 201 includes a light source 202 and an illumination optical unit that is symbolized in highly simplified fashion by lens elements 203, 204 and a stop to 205. The operating wavelength of the projection exposure apparatus 200 in the example shown is 193 nm when using an ArF excimer laser as the light source 202. However, the operating wavelength can for example also be 248 nm when using a KrF excimer laser or 157 nm when using an $F_2$ laser as the light source 202. A mask 207 that is held in the beam path using a mask holder 206 is arranged in the object plane OP of the projection lens 208 between the illumination device 201 and the projection lens 208. The mask 207 has a structure in the micrometer to nanometer range that is imaged, for example reduced by the factor 4 or 5, onto an image plane IP of the projection lens 208 by way of the projection lens 208. The projection lens 208 includes a lens arrangement by way of which an optical axis OA is defined, the lens arrangement likewise merely being symbolized in highly simplified fashion by lens elements 209 to 212. A substrate 216, or a wafer, that is provided with a light-sensitive layer 215 and positioned by way of a substrate holder 218, is held in the image plane IP of the projection lens 208. An immersion medium 250, which may be for example deionized water, is situated between the optical element 220 of the projection lens 208 that is located last on the image plane side and the light-sensitive layer 215.

During operation of the projection exposure apparatus in accordance with FIG. 1 or FIG. 2, for example heat-related imaging aberrations can occur due to various causes without additional measures. To correct such imaging aberrations or generally to optimize the optical properties, one or more of the optical elements (e.g., mirrors) can be embodied in the respective projection exposure apparatus in the form of adaptive or actuable elements.

Proceeding on this basis, an example of a specific application of the present disclosure will be explained below with reference to FIGS. 3A-3E. In this specific application, a light beam S (or thereof in the x- or y-direction) that, during the operation of a projection exposure apparatus for example in accordance with FIG. 1 or FIG. 2, emanates from a light source or illumination device 310 and travels through the respective projection lens (designated with "320" in FIGS. 3A-3E) can been manipulated with respect to the x-y coordinates of the point of incidence in the image plane IP by way of control signals A and B, and with respect to the diameter by way of a further control signal C. An image point p can be described here as p:=[x,y,d], wherein x indicates the image point coordinate in the x-direction, y indicates the image point coordinate in the y-direction, and d indicates the diameter of the image point.

Figure 3A:
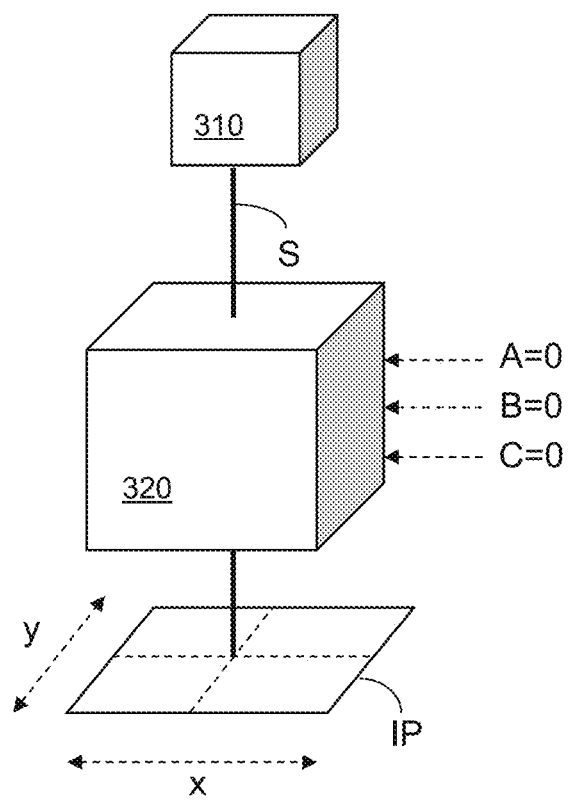
Figure 3B:
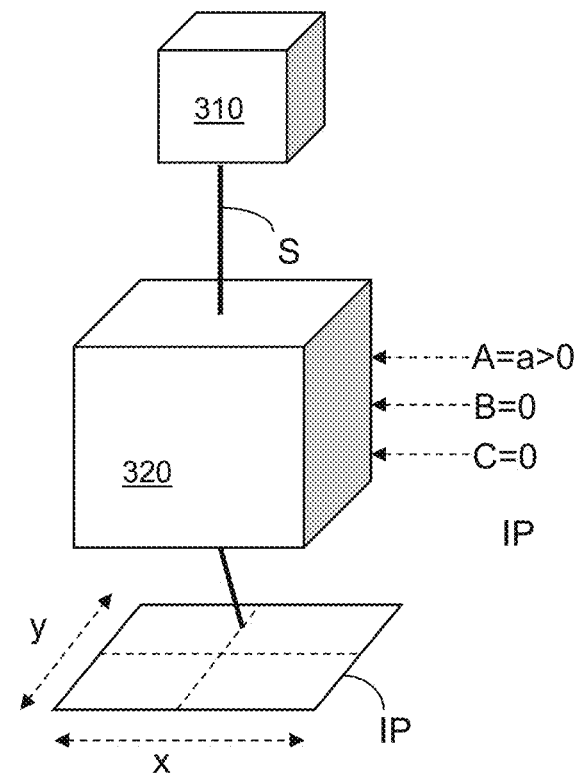
Figure 3C:
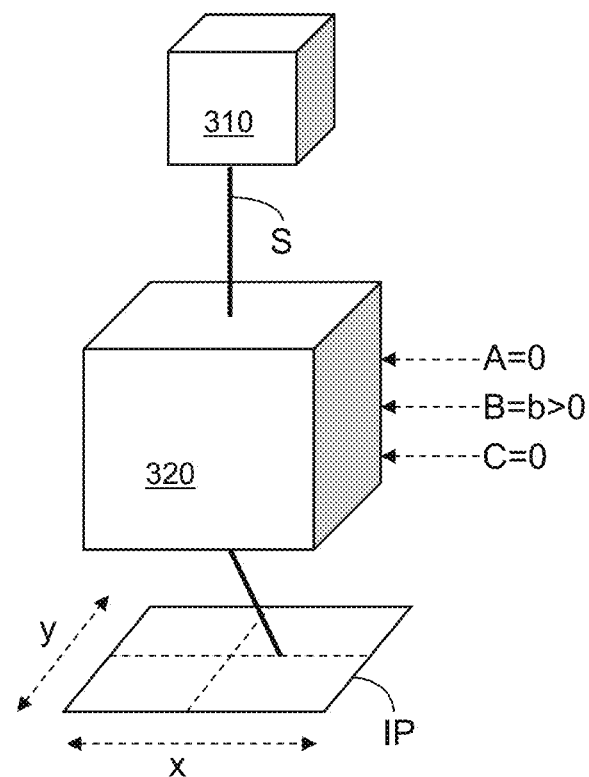
Figure 3D:
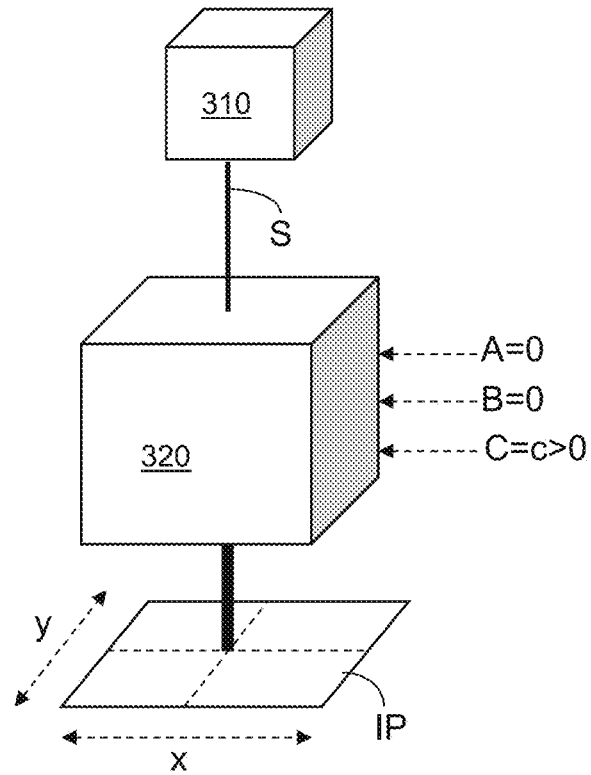

The control signals A, B and C are supplied to the projection lens via corresponding control inputs (which can be designed, merely by way of example, in the form of numerical interfaces). In the schematic illustrations, FIG. 3B illustrates the manipulation of the point of incidence of the light beam S in the image plane IP in the y-direction via the control signal A, FIG. 3C illustrates the manipulation of the point of incidence of the light beam S in the image plane IP in the x-direction via the control signal B, and FIG. 3D illustrates the manipulation of the diameter of the light beam S in the image plane IP via the control signal C.

Merely by way of example (and without the disclosure being limited hereto), it is possible using the control signals to control for example a deformable mirror present in the projection lens to change the surface curvature of the mirror for the purposes of modifying the imaging properties of the projection lens (for example for compensating a disturbance present in the system).

It is now assumed below that the corresponding actuators are to be controlled for the deformation of the mirror during the microlithographic exposure process on the basis of a model that ultimately describes the relationship between the image point produced (defined by way of the x-coordinate and y-coordinate and the diameter d of the light beam S) and the control signals A, B and C, that is to say in other words indicates the reaction of the projection lens 320 to specific values of the control signals A, B and C.

According to the present disclosure, this model is now not explicitly specified, but rather "worked out" implicitly as part of a learning phase or training on the real system or projection lens.

As part of an explicit modeling—which is avoided according to the disclosure—it would be possible for example for the relationship between the image point p=[x, y,d] and the control signals A, B and C to use as a basis an explicit model as follows:

$$[x,y,d]=f(A,B,C)=[A,B,C] \quad (1)$$

However, explicit modeling in accordance with (1) is already not suitable for describing a more complex relationship as occurs for example when the relevant real system or the projection lens 320 exhibits specific "unique properties" for example due to manufacturing errors, unfavorable tolerance situations, etc., with the consequence that the diameter d of the image point produced in the image plane IP is influenced not solely by the control signal C but also additionally via the control signals A and B. Such a scenario is illustrated in FIG. 3E, where the diameter of the light beam S in the image plane IP changes despite a value of C=0 for the control signal C intended for the manipulation of the diameter of the light beam IP and values for the control signals A, B not equaling zero.

Taking into account the above-described scenario would involve, with explicit modeling, an adaptation of the structure of the model, e.g., as per $$f(A,B,C)=[A,B,g(A,B,C)] \quad (2)$$

To ascertain the diameter of the image point, in addition to the control signal C, additional information relating to the control signals A and B is thus involved in this case. This in turn can entail significant outlay, because in practice any conceivable behavior of the real system or projection lens in dependence on all conceivable influencing variables would have to be stated.

Due to the implicit modeling according to the disclosure, it is now possible to address in particular the above-described issue. A distinction is made here between the "implicit modeling" according to the disclosure and the above-described "explicit modeling" in that, instead of specifying a formal description of the lens behavior, an "empty" model (that is to say a model which is not specified or predetermined in detail) is used initially, wherein only respectively permissible input values for the control variables A, B and C are defined and in this respect the corresponding behavior of the real system or the projection lens is assessed on the basis of the respective results for x, y and d (that is to say the x-coordinate and y-coordinate and the diameter d of the image point produced in the image plane IP).

This initial use of an "empty" model which is not specified or predetermined in detail can be written as $$[x,y,d]=h(A,B,C)=? \quad (3)$$

The model is then created in the course of a learning phase or via training on the real system or a projection lens by virtue of the results for x, y and d that are obtained in each case with the real system for different combinations of permissible input values for the control variables A, B and C being ascertained. To this end, a for example camera-based detector (e.g., CCD camera) for the spatially resolved determination of the light intensity can be placed in the image plane IP.

In a simple case, all combinations of permissible input values for the control variables A, B and C could be "tried out" in advance and in each case the obtained results for x, y and d could be ascertained, as a result of which a three-dimensional table is obtained that represents the desired implicit model. If a specific value combination [x, y, d] is then desired in the actual lithography process that is subsequently performed, the choice of the control variables A, B and C that is suitable herefor can be read from the relevant table or the model.

The implicit model can be efficiently created by methods of artificial intelligence. The method according to the disclosure here has the advantage that the model during the learning phase is created in each case with automatic adaptation to the real system or projection lens, wherein in particular at no time is a modification of the model structure required, as in the case of explicit modeling in the previously described scenario.

Even though the disclosure has been described on the basis of specific embodiments, numerous variations and alternative embodiments are apparent to a person skilled in the art, for example by combination and/or exchange of features of individual embodiments. Accordingly, it goes without saying for a person skilled in the art that such variations and alternative embodiments are also included by the present disclosure, and the scope of the disclosure is restricted only within the meaning of the accompanying patent claims and the equivalents thereof

What is claimed is:

1. A method, comprising:
    modifying imaging properties of a microlithographic optical system via control signals coupled into the optical system via at least one interface,
    wherein:
        values of the control signals that are in each case coupled in during the controlling for a desired modification of the imaging properties are ascertained on the basis of a model;
        the model is created by virtue of performing, in a learning phase in which the modification of the imaging properties that is in each case attained for different values of the control signals is ascertained, a successive individual adaptation of the model to the optical system; and
        the learning phase is performed without prior specification of explicit information relating to internal mechanisms of action within the optical system.

2. The method of claim 1, further comprising using a method of artificial intelligence to create the model, wherein the learning phase further comprises training with coupling of different values of the control signals into the optical system.

3. The method of claim 2, wherein the method of artificial intelligence is selected from the group consisting of supervised learning, unsupervised learning, and semi-supervised learning.

4. The method of claim 2, wherein the model is adapted to the optical system in the learning phase without modification of a model structure.

5. The method of claim 2, wherein the model correlates only imaging properties that are observable from outside the optical system with control signals that are variable from outside the optical system.

6. The method of claim 1, wherein the model is adapted to the optical system in the learning phase without modification of a model structure.

7. The method of claim 1, wherein the model correlates only imaging properties that are observable from outside the optical system with control signals that are variable from outside the optical system.

8. The method of claim 1, further comprising, based on the control signals, controlling at least one actuator to actuate at least one optical element of the optical system to modify imaging properties of the optical system.

9. The method of claim 8, wherein the optical element comprises a deformable optical element.

10. The method of claim 1, wherein:
    the optical system comprises a microlithographic projection exposure apparatus which comprises an illumination device and a projection lens;
    the illumination device illuminates a mask comprising structures in an object plane of the projection lens; and
    the projection lens images the structures onto a substrate arranged in an image plane of the projection lens.

11. A method, comprising:
    a) without knowing imaging properties of a microlithographic optical system as a function of control signals coupled into the microlithographic optical system, repeatedly varying the values of the control signals coupled into a microlithographic optical system and ascertaining corresponding values of modifications of imaging properties of the microlithographic optical system to create a model; and b) using the model to ascertain values of the control signals coupled into the microlithographic optical system for a desired modification of the imaging properties of the microlithographic optical system.

12. The method of claim 11, further comprising using a method of artificial intelligence to create the model, wherein a) further comprises training with coupling of different values of the control signals into the optical system.

13. The method of claim 12, wherein the method of artificial intelligence is selected from the group consisting of supervised learning, unsupervised learning, and semi-supervised learning.

14. The method of claim 12, comprising, during a), adapting the model to the optical system without modification of a model structure.

15. The method of claim 12, wherein the model correlates only imaging properties that are observable from outside the optical system with control signals that are variable from outside the optical system.

16. The method of claim 11, comprising, during a), adapting the model to the optical system without modification of a model structure.

17. The method of claim 11, wherein the model correlates only imaging properties that are observable from outside the optical system with control signals that are variable from outside the optical system.

18. The method of claim 11, further comprising, based on the control signals, controlling at least one actuator to actuate at least one optical element of the optical system to modify imaging properties of the optical system.

19. The method of claim 18, wherein the optical element comprises a deformable optical element.

20. The method of claim 11, wherein:
the optical system is a microlithographic projection exposure apparatus comprising an illumination device and a projection lens;
the illumination device illuminates a mask comprising structures in an object plane of the projection lens; and
the projection lens images the structures onto a substrate arranged in an image plane of the projection lens.

* * * * *

UNITED STATES PATENT AND TRADEMARK OFFICE
CERTIFICATE OF CORRECTION

PATENT NO. : 10,649,343 B2
APPLICATION NO. : 16/444323
DATED : May 12, 2020
INVENTOR(S) : Jochen Knopf and Mohammad Awad It is certified that error appears in the above-identified patent and that said Letters Patent is hereby corrected as shown below:

In the Specification

Column 8, Line 6, after "thereof" insert -- . --.

Signed and Sealed this
Thirtieth Day of June, 2020

Andrei Iancu
*Director of the United States Patent and Trademark Office*